US006499121B1

United States Patent
Roy et al.

(10) Patent No.: US 6,499,121 B1
(45) Date of Patent: *Dec. 24, 2002

(54) DISTRIBUTED INTERFACE FOR PARALLEL TESTING OF MULTIPLE DEVICES USING A SINGLE TESTER CHANNEL

(75) Inventors: Richard S. Roy, Danville, CA (US); Charles A. Miller, Fremont, CA (US)

(73) Assignee: FormFactor, Inc., Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/260,463

(22) Filed: Mar. 1, 1999

(51) Int. Cl.[7] .......................... G01R 31/28; G11C 29/00
(52) U.S. Cl. ........................................ 714/724; 714/718
(58) Field of Search ................................ 714/718, 719, 714/724, 736

(56) References Cited

U.S. PATENT DOCUMENTS

| | | |
|---|---|---|
| 3,821,645 A | 6/1974 | Vinsani |
| 4,370,746 A | 1/1983 | Jones et al. |
| 4,455,654 A | 6/1984 | Bhaskar et al. |
| 4,500,836 A | 2/1985 | Staudacher |
| 4,517,512 A | 5/1985 | Petrich et al. |
| 4,773,028 A | 9/1988 | Tallman |
| 4,942,576 A | 7/1990 | Busack et al. |
| 5,070,297 A | 12/1991 | Kwon et al. ................. 324/158 |
| 5,243,274 A * | 9/1993 | Kelsey et al. ................ 714/724 |
| 5,357,523 A * | 10/1994 | Bogholtz, Jr. et al. ....... 714/718 |
| 5,404,099 A | 4/1995 | Sahara |
| 5,442,282 A | 8/1995 | Rostoker et al. |
| 5,461,310 A * | 10/1995 | Cheung et al. ........... 324/158.1 |
| 5,497,079 A | 3/1996 | Yamada et al. |
| 5,506,499 A * | 4/1996 | Puar ......................... 324/158.1 |

(List continued on next page.)

FOREIGN PATENT DOCUMENTS

JP 06027195 5/1994

OTHER PUBLICATIONS

Aigner, Mitch "Embedded At–Speed Test Probe", International Test Conference, 1997, pp. 932–937.

IBM Technical Disclosure Bulletin, (Publication No. XP–000627991), "N–UP Test Adapter", vol. 39, No. 7, pp. 243–244, Jul. 1996.

Primary Examiner—Albert Decady
Assistant Examiner—Joseph D. Torres
(74) Attorney, Agent, or Firm—Blakely, Sokoloff, Taylor & Zafman LLP

(57) ABSTRACT

A system for testing a number of integrated circuit (IC) devices under test (DUTs) having interface circuitry coupled to a single or multi-channel tester for receiving data values from the tester and providing error information concerning the DUTs. The interface circuitry forwards data values (received from the tester over a single channel) to a number of DUTs in parallel. The circuitry performs comparisons using data values read from the DUTs, and in response generates error values indicative of the comparison. The error values may then be returned to the tester over the same or a different channel.

9 Claims, 11 Drawing Sheets

U.S. PATENT DOCUMENTS

| | | | |
|---|---|---|---|
| 5,546,405 A | 8/1996 | Golla | |
| 5,625,297 A | 4/1997 | Arnaudov et al. | |
| 5,642,054 A | 6/1997 | Pasiecznik, Jr. | |
| 5,648,661 A | 7/1997 | Rostoker et al. | |
| 5,682,472 A * | 10/1997 | Brehm et al. | 714/25 |
| 5,689,515 A * | 11/1997 | Panis | 714/724 |
| 5,736,850 A | 4/1998 | Legal | |
| 5,794,175 A * | 8/1998 | Conner | 702/119 |
| 5,839,100 A * | 11/1998 | Wegener | 704/220 |
| 5,910,895 A * | 6/1999 | Proskauer et al. | 700/121 |
| 5,923,178 A * | 7/1999 | Higgins et al. | 324/754 |
| 5,995,424 A * | 11/1999 | Lawrence et al. | 365/201 |
| 5,995,915 A | 11/1999 | Reed et al. | |
| 6,064,213 A | 5/2000 | Khandros et al. | |
| 6,064,948 A * | 5/2000 | West et al. | 702/119 |
| 6,087,843 A * | 7/2000 | Pun et al. | 324/765 |
| 6,184,048 B1 * | 2/2001 | Ramon | 438/14 |
| 6,184,053 B1 | 2/2001 | Eldridge et al. | |
| 6,246,250 B1 | 6/2001 | Doherty et al. | |
| 6,256,760 B1 * | 7/2001 | Carron et al. | 714/726 |
| 6,275,962 B1 * | 8/2001 | Fuller et al. | 714/724 |
| 6,330,164 B1 | 12/2001 | Khandros et al. | |

\* cited by examiner

DISTRIBUTED INTERFACE FOR PARALLEL TESTING OF MULTIPLE DEVICES USING A SINGLE TESTER CHANNEL

The subject matter in this application is related to material in two other U.S. patent applications of Roy and Miller, entitled PARALLEL TESTING OF INTEGRATED CIRCUIT DEVICES USING CROSS-DUT AND WITHIN-DUT COMPARISONS, having Ser. No. 09/260,459 (P077), and EFFICIENT PARALLEL TESTING OF INTEGRATED CIRCUIT DEVICES USING A KNOWN GOOD DEVICE TO GENERATE EXPECTED RESPONSES, having Ser. No. 09/260,460 (P078) filed on the same date as this application and expressly incorporated herein by reference.

BACKGROUND INFORMATION

This invention is related to the testing of integrated circuit devices using a semiconductor tester, and more particularly to testing a number of devices in parallel using a single channel of the tester for greater efficiency and throughput.

Integrated circuit (IC) devices are an important part of almost every modern electronic or computer system. To reduce the manufacturing cost of such systems, the manufacturer expects each constituent IC device to be free of defects and to perform according to its specifications. Thus, it is not unusual to expect that every IC device is subjected to rigorous testing prior to being shipped to the system manufacturer.

It has been determined, however, that a significant portion of the total cost of producing an IC device can be attributed to its testing. That is because many modern IC devices perform complex functions, have a large number of inputs and outputs, and operate at high speeds. For instance a 256 Mb memory device may have 16 data lines and 22 address lines. A simplistic approach to test such a device would be to write a known data value to each memory location, and then read from each location, and then compare the value read to the expected or written value to determine any errors. However, because of the large number of locations, each containing several bits, such a technique of testing each bit of each location is very time consuming. As a result, the field of test engineering has developed to create efficient techniques for detecting as many errors as possible while using the least number of test sequences.

A memory device may be tested using an automated semiconductor tester. FIG. 1 shows such a tester 108 having a number (N) of channels for parallel testing of a number of devices under test (DUTs) such as DUT 118. The tester 108 normally executes a test program and in response generates data and addresses on each channel which define a complex test sequence 106 engineered for testing the particular DUTs. Each channel of the tester 108 feeds a respective DUT so that a number of DUTs, corresponding to the number of channels, are tested simultaneously. A probe card (not shown) receiving all N channels delivers address and write data of the test sequence 106 to locations in N different DUTs simultaneously, while the DUTs are still part of a semiconductor wafer 116. The tester 108 then reads from those locations and performs a comparison with expected data it generates. The results of the comparison help determine whether a particular bit read from a location in a DUT is in error. The tester 108 performs the above read and write cycles many times with the same or different data patterns to verify as many locations of the DUTs as possible given time and budget constraints.

To increase throughput in terms of the number of DUTs tested per unit time, a larger tester may be built having more channels. Such a solution, however, could be prohibitively expensive. The tester is a complex and high speed machine, requiring much time and expense to modify or improve. Moreover, a single channel of a modern tester may comprise between 50 to 100 signal wires, such that increasing the number of channels between the tester and the probe card will make it physically impractical to connect all of the signal wires to the probe card. Therefore, a more efficient solution for increasing the throughput of an IC test system is needed.

SUMMARY

Accordingly, an embodiment of the invention is directed to interface circuitry that essentially acts as a relay between the tester and a number of DUTs, where test vectors on each channel are fanned out to multiple DUTs. In general, the test vectors include stimuli, such as addresses, data values, and control signals, that are passed on to the DUTs while maintaining any timing constraints between the stimuli that were set up by the tester. The responses by the DUTs to these stimuli may then be collected by the interface circuitry and relayed back to the tester. If desired, the interface circuitry may be further enhanced with error detection capability based on the responses. For instance, the response from each DUT may be evaluated for internal consistency, by within-DUT and across-DUT comparisons, or it may be evaluated by comparison to expected responses received from the tester. The results of the comparison may then be provided back to the tester in summary or in detail form.

In a further embodiment, the interface circuitry features an input for receiving test data, expect data (test vectors), and control values from the tester. An output drives the test data into a number. DUTs and then subsequently reads the data from the DUTs. Comparison circuitry provides error information in response to performing a comparison between data values read from each of the DUTs and expected data received from the tester. A storage area for the error information may be provided as part of the interface circuitry. The interface circuitry thus allows each channel of the conventional tester to be used to test not just a single DUT but a number of DUTs, preferably in parallel.

According to another embodiment of the invention, a system is disclosed for testing a number of DUTs, having a conventional tester with a number of sets of tester input/output (I/O) lines, the tester providing data values on each set of tester I/O lines for testing a single DUT, and a probe card having a number of probe elements for contacting a number of signal locations of two or more DUTs. The interface circuitry is aboard the probe card and has an input coupled to one of the sets of tester I/O lines and an output coupled to the probes. The interface circuitry transports data values from its input to its output, and performs a comparison using data values read from the DUTs to determine errors, if any, in the DUTs. Multiple DUTs may thus be tested by each channel of the tester, without disturbing the test sequence that was previously created to test a single DUT. The tester program inside the tester may be modified to read the error information through the same set of tester I/O lines after the test sequence has been completed.

In a particular embodiment, the results of the comparison (error information) are returned to the tester via the same channel in response to the tester requesting a read of previously written data. The tester program is modified to recognize that the error information received in response to its read request concerns a number of DUTs rather than just a single DUT.

In a particular embodiment, the DUTs are memory devices and the error information represents a difference between a data value read from each of the memory devices and an expected data value received by the interface circuitry from the tester for a pre-defined address/location.

These as well as other features and advantages of various embodiments of the invention can be better appreciated by referring to the claims, written description, and drawings below.

DETAILED DESCRIPTION

Figure 2:
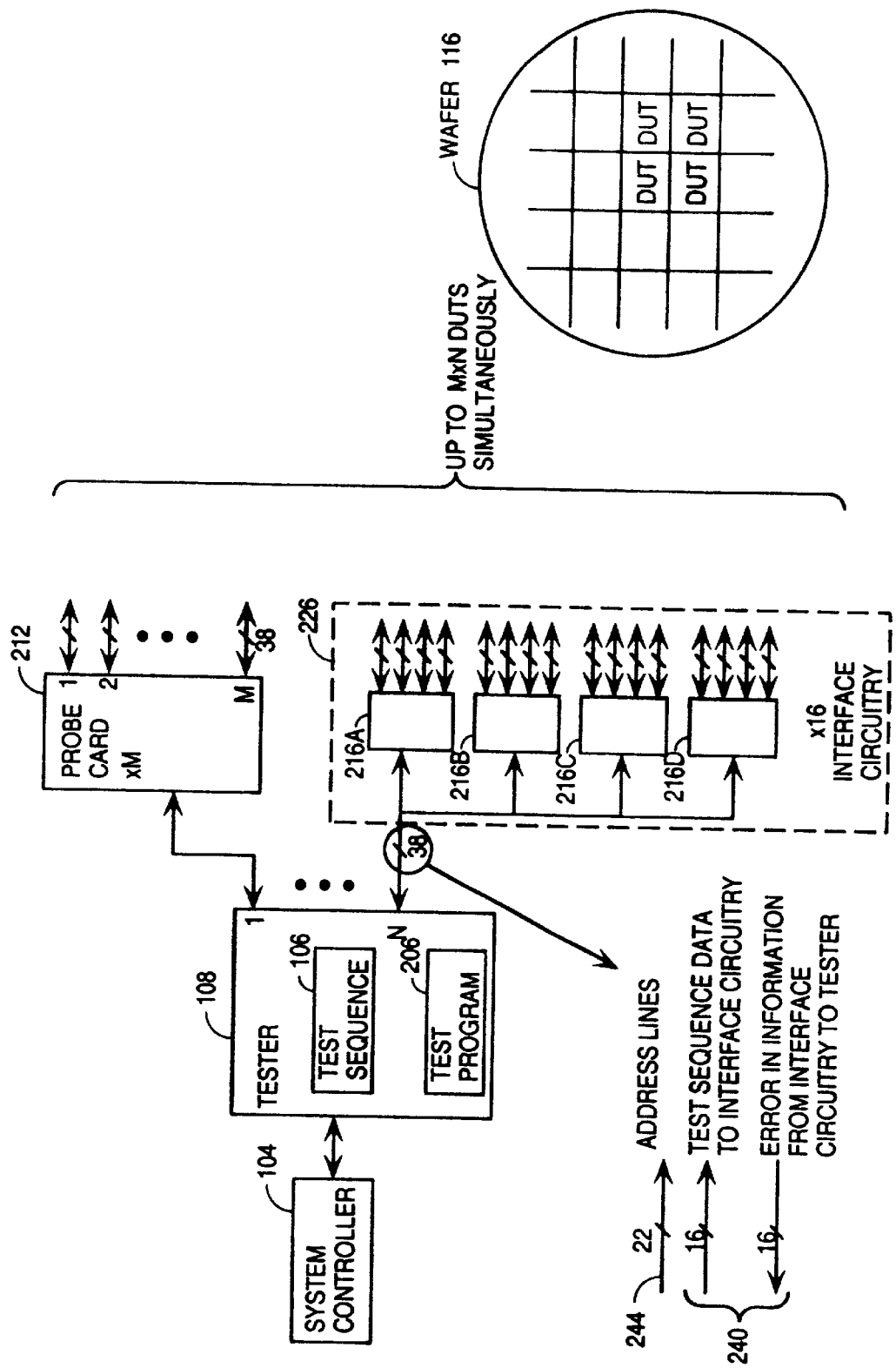
FIG. 2 shows a block diagram of a system for testing a number of DUTs by each channel of a conventional tester, according to an embodiment of the invention.

FIG. 2 illustrates an embodiment of the invention as a system for testing multiple DUTs using a single channel of a conventional semiconductor tester. The DUT may be an entire IC die, such as a memory chip, or it may be an arbitrary semiconductor device having a memory portion. The DUTs are normally similar, and preferably identical, devices. The test system features an N channel tester 108 that operates according to a test program 206. The tester 108 may be part of an IC manufacturing and test line which features a system controller 104. The system controller 104 is responsible for orchestrating a process flow of manufacturing and test operations for the DUTs. While executing the test program 206, a test sequence 106 is followed and test vectors, including data values and associated addresses and perhaps other control signals, are provided on each channel according to conventional techniques. For instance, in the embodiment shown in FIG. 2, there are 22 address lines in address bus 244 and 16 data lines in data bus 240 (control signals not shown). Of course, one of ordinary skill in the art will recognize that other bus configurations and widths may alternatively be used, depending on the overall performance desired and the particular type of DUT being tested. The data lines are used to transport the test sequence data to interface circuitry 226. In certain versions of the invention, the same data lines may be used to return error information back to the tester 108. This complies with the conventional bi-directional use of the data lines of a tester channel.

The interface circuitry 226 for each channel is divided into subcircuits 216a, 216b, . . . Each subcircuit 216 can drive a combination of inputs and monitor a combination of outputs of one or more DUTs. Each subcircuit 216, for this particular embodiment, is configured to communicate with four DUTs simultaneously. One of ordinary skill in the art will recognize that each subcircuit can be configured to interface with fewer than or greater than four DUTs. Each subcircuit 216 forwards a test vector received from the single channel to each of four DUTs. The data value and its associated address are applied to each of the DUTs, perhaps following an address mapping to corresponding addresses in each of the DUTs.

When the tester 108 enters a read cycle, the tester 108 provides expected data and associated addresses to each subcircuit 216. Each subcircuit 216 reads data from corresponding addresses in the DUTs. Comparisons are then performed by the subcircuit between the expected data and the read data to determine if the data read from the DUTs contains any errors. In certain cases, the subcircuit may be designed to provide the error information back to the tester 108 in real-time, such that the tester 108 can abort further testing. The tester may also collect the errors for subsequent analysis or for repair of a DUT, for example by selecting among redundant circuit elements in the DUT.

Figure 1:
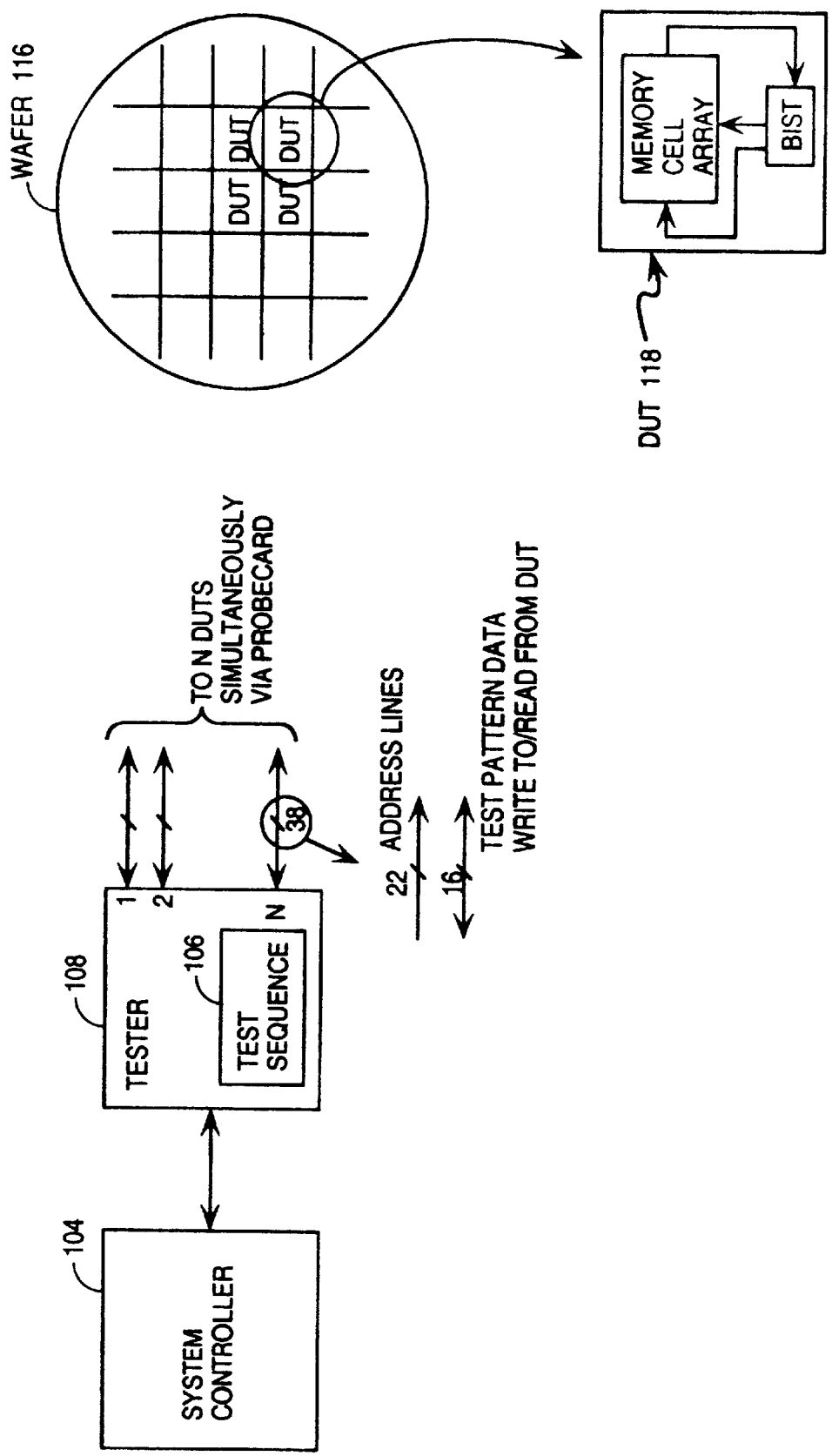
FIG. 1 illustrates a prior art system for testing IC devices, with one DUT per channel of the tester.

In a particular embodiment, the error information generated by the interface circuitry 226 is provided back to the tester 108 through the same channel that was used for receiving expected data. However, the added fan-out provided by the interface circuitry 226 restricts the number of bits that can be used to return error information simultaneously for all DUTs. For instance, when sixteen DUTs are being tested by a 16-bit (data bus) channel as shown in FIG. 1, only 1 bit of error information can be provided per DUT if each DUT is assigned a channel. The amount of error information that is necessary to return to the tester 108 may depend on the type of testing that the process flow requires. For instance, in final test, a simple "go-no go" bit per DUT may be adequate. When testing for redundant repair, the size and configuration of the repairable circuit elements influences the bandwidth of the error information that is required.

Figure 3:
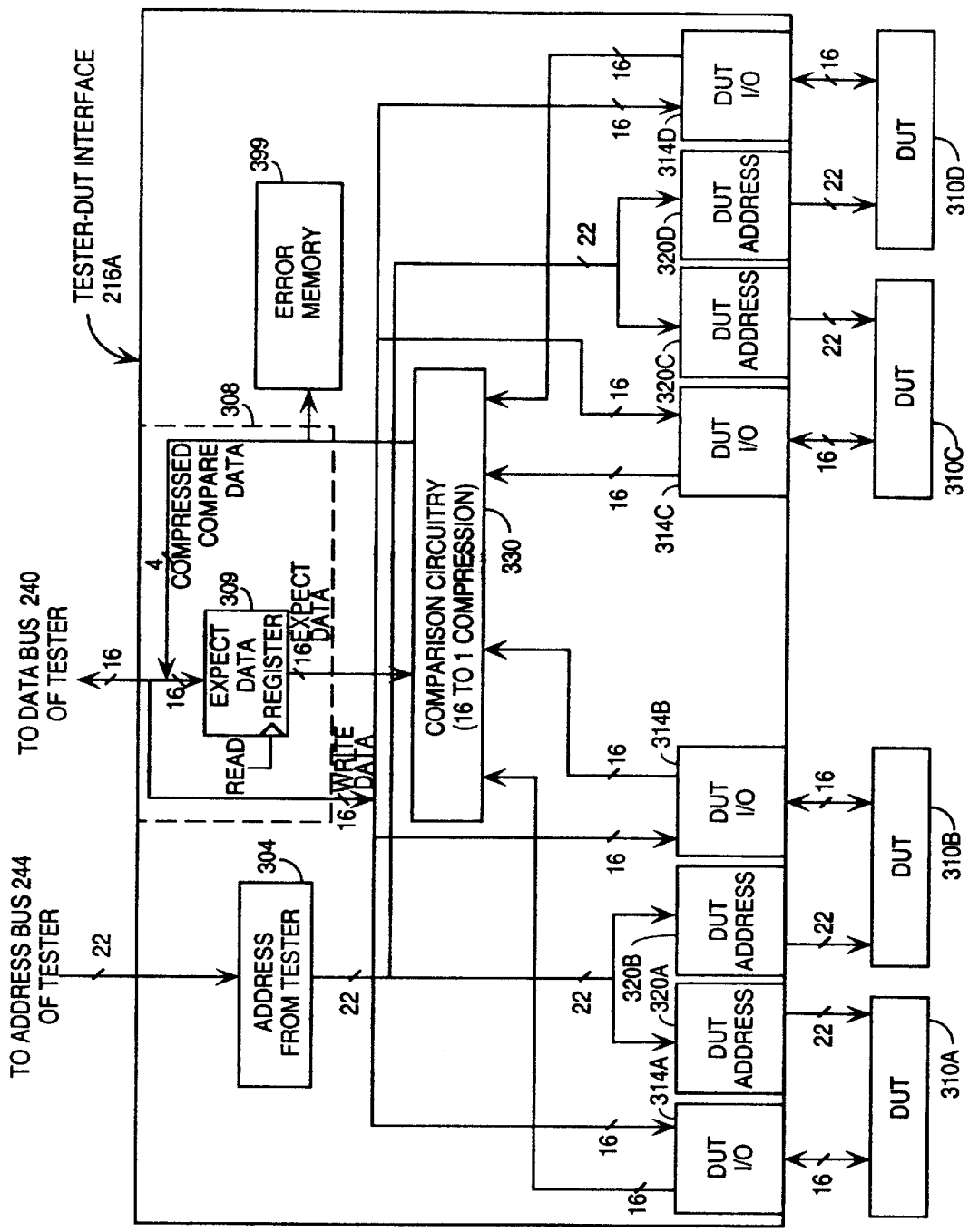
FIG. 3 illustrates a block diagram of an interface circuit according to an embodiment of the invention.

FIG. 3 shows a high level block diagram of the internal architecture of a tester-DUT interface subcircuit 216a. A channel address port 304 is provided to receive addresses from the address bus 244 and control signals from a control bus (not shown) of a single channel. A tester data I/O port 308 is provided to receive data values from the data bus 240 of the single channel. An expect data register 309 is clocked by a read control signal received from the channel's control bus (not shown) to latch the expected data. In this embodiment, four of the 16 lines of the data bus are used by the subcircuit 216a to return error information back to the tester 108 regarding four DUTs, 310a, 310b, 310c, and 310d. The remaining 12 lines will be used in a similar fashion by the other subcircuits 214b, 214c, and 216d.

On the DUT side, DUT I/O ports 314a, 314b, 314c, and 314d are provided as a data interface with their corresponding DUTs. Note that the 16 data bits received through the tester I/O port 308 are copied to all four DUT I/O ports which in turn forward the data to their respective DUTs. A number of DUT address ports 320a, 320b, 320c, and 320d are provided for delivering the received address or a mapped address to each respective DUT.

Figure 4:
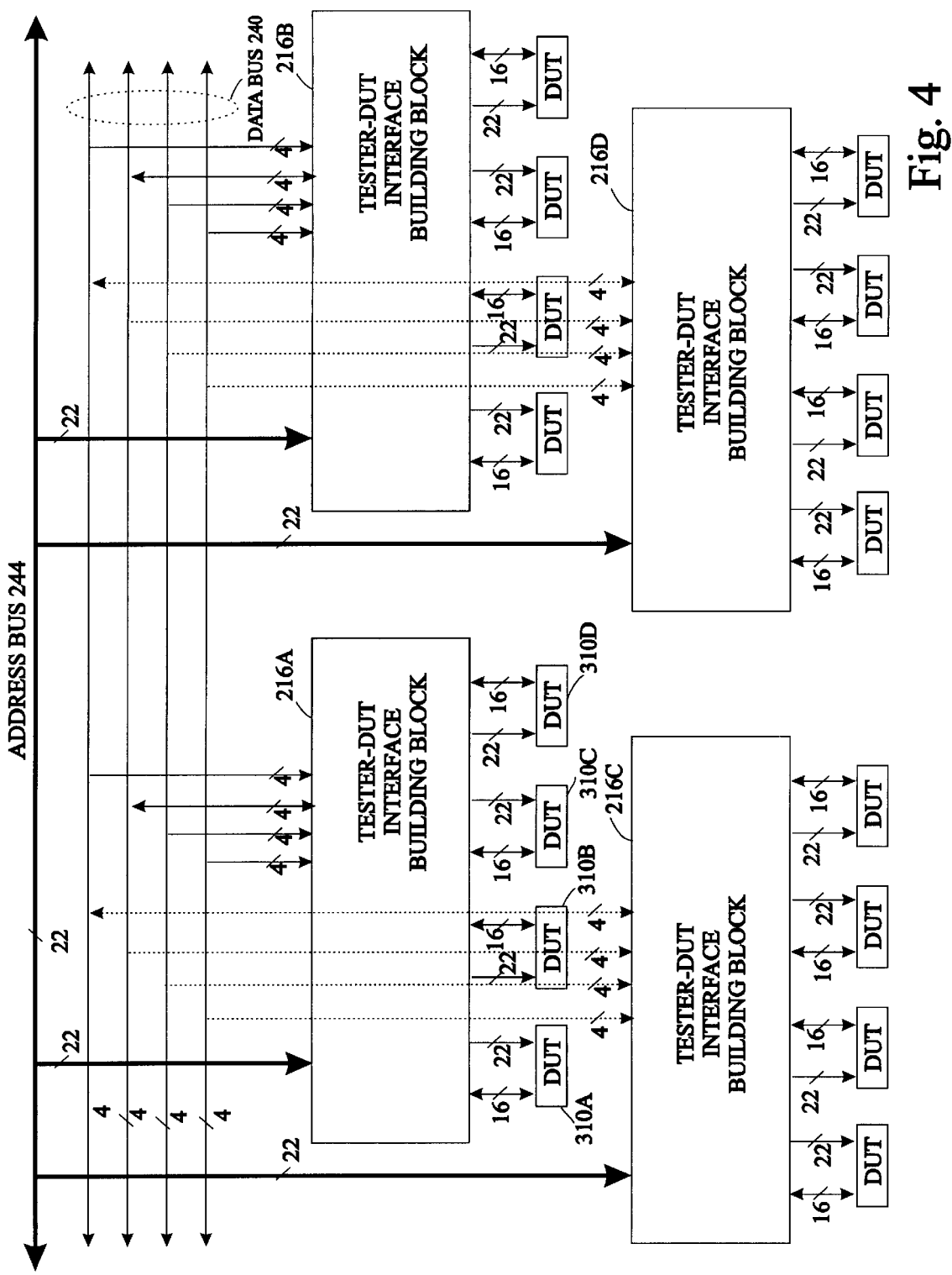
FIG. 4 shows a block diagram of tester-DUT interface circuitry for testing 16 DUTs simultaneously using a single channel of the tester, according to an embodiment of the invention.

Comparison circuitry 330 receives read data from each respective DUT and performs a comparison to determine whether the read data exhibits any errors. In the embodiment of FIGS. 2–4, a 16:1 compression is performed by the comparison circuitry 330. This means that for every 16 bits of data at each location of a DUT, 1 error bit is generated by each subcircuit 216, such that for each address, 16 error bits in total are provided by the interface circuitry 226 on the data bus 240 of the tester channel. FIG. 4 shows a detail of four tester-DUT interface subcircuits 214a, 214b, 214c, and 216d and how they may be coupled to the address and data buses of a single tester channel. Each subcircuit 216 provides 4 bits of error information on the data bus, for a total of 16 bits corresponding to four sets of four DUTs each. Other ways of configuring the interface circuitry 226 for testing a greater number of DUTs simultaneously, using a single channel of the tester 108, may be devised by one of ordinary skill in the art. These configurations depend on the amount of error data required by the process flow. For instance, in a final test scenario, a single fail bit might be sufficient for each DUT. In other cases, a fail bit per address/location may be sufficient. Also, rather than using the parallel bus approach shown in FIG. 4, a serial link might alternatively be used to connect the interface circuitry 226 to the tester 108 or system controller 104.

Returning briefly to FIG. 2, the interface circuitry 226 may be part of a probe card 212 which is coupled to a separate channel of the tester 108. The probe card 212 shown in FIG. 2 provides a fan-out of M, so that its channel is coupled to M different DUTs simultaneously on a wafer 116. Therefore, a system using a conventional N-channel tester 108 normally capable of testing 16 DUTs, one DUT per channel, would be capable of testing M×N DUTs simultaneously if equipped with N probe cards.

Figure 5:
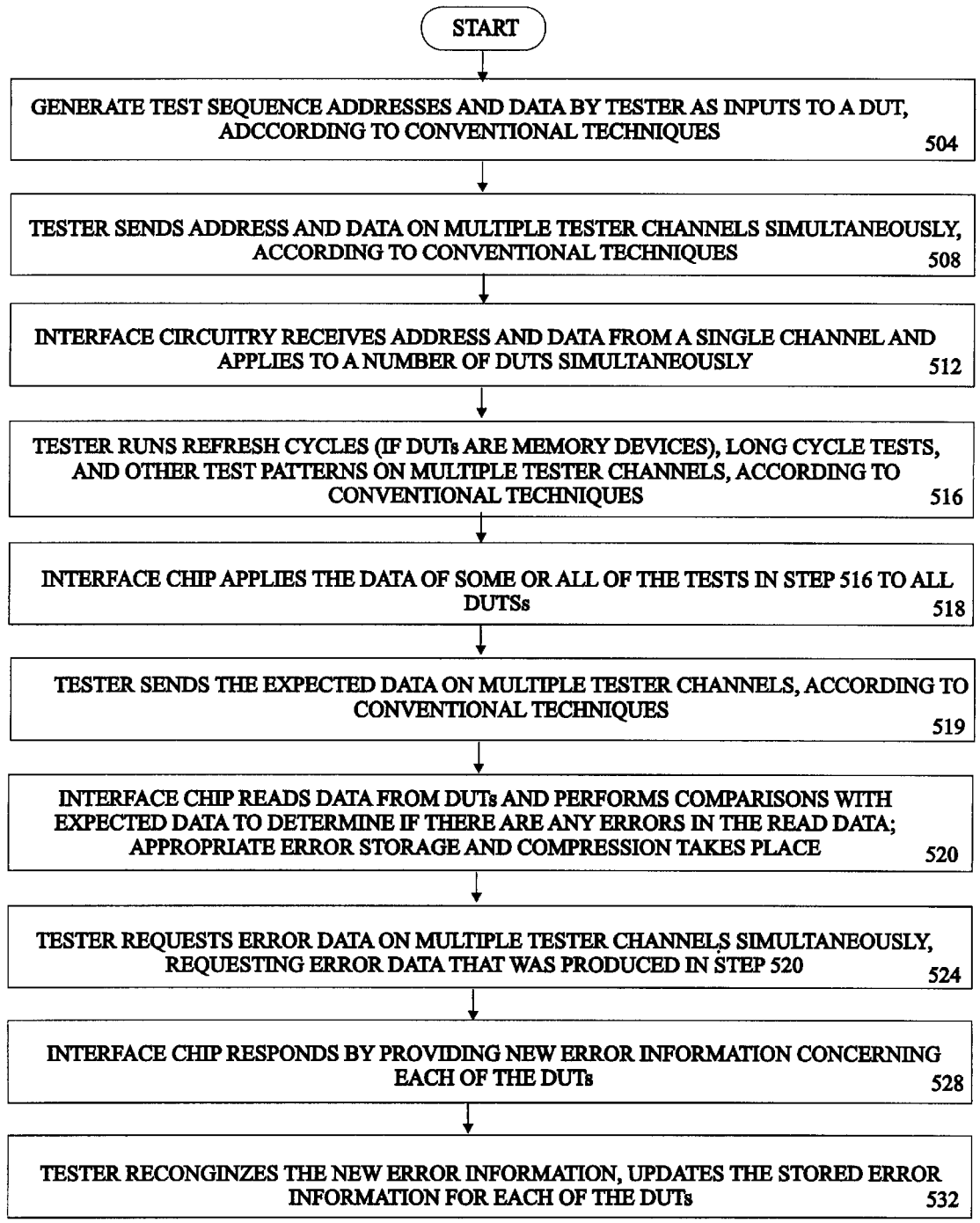
FIG. 5 is a flow diagram of operations performed in a system for testing IC devices using expected data received form the tester, according to an embodiment of the invention.

FIG. 5 illustrates a flow diagram of the operations performed in a system for testing IC devices, according to an embodiment of the invention. Operation may begin with step 504 in which the tester 108 generates addresses and data for a test sequence to be applied as inputs to a single DUT. This may be done according to conventional test engineering techniques of generating a data value and an associated address on each channel of the tester 108. Operation proceeds in step 508 where the tester sends the data and associated address on multiple tester channels simultaneously, once again according to conventional techniques. Operation then proceeds with step 512 in which the interface circuitry 226 receives the data and addresses over a single channel, and in response applies the data to a number of DUTs simultaneously. The addresses presented to each of the DUTs may be the same as the addresses received from the tester. Alternatively, an address received from the tester 108 may be mapped to different, corresponding addresses/locations in the DUTs. This mapping allows the interface circuitry 226 to be configured for single DUT operation, where the tester 108, if so programmed, can access any location in any of the DUTs, preferably after the test sequence has been completed. The added latency due to the interface circuitry 226 when forwarding the data to the DUTs (which may not have been present when each channel was handling only a single DUT) may be easily handled by inserting a systematic delay between consecutive read or consecutive write commands in the test program or in the interface circuitry 226.

After the tester 108 has delivered the address and data over the channels, operation may proceed with step 516 in which the tester 108 may optionally run refresh cycles if the DUTs are memory devices, or arbitrary semiconductor devices including memory portions. In addition, long cycle tests and other test patterns which may be designed to stress the electrical parameters of the DUTs may be delivered to the interface circuitry 226, as in step 512. The interface circuitry 226 will normally be configured to mimic such sequences to all of the DUTs. Operation then proceeds with step 519 in which the tester sends an expected data value to the interface circuitry 226, while simultaneously initiating a read from each DUT. The expected data value and its associated address are normally the same as the data and address that were sent by the tester in step 508. Operation then proceeds with step 520 where the interface circuitry 226 latches the expected data from the channel, reads data from corresponding locations in the DUTs, and performs comparisons between the read data and the expected data to determine if there are any errors in the read data.

The results of such a comparison may then be compressed, sent back to the tester 108 or system controller 104, or stored in memory 399 (see FIG. 3). The error information may be returned to the tester either in real-time or as a post process, using the same channel over which the expected data arrived. The compression depends on the number of DUTs being tested by each channel and the width of the data bus in the channel. For instance, when sixteen DUTs are tested by each channel having a 16-bit data bus, a 16:1 compression may be performed so that 1 bit of error information is available per DUT. This, of course, means that if there is an error in 1 or more of the 16 bits at a given location read from a DUT, the exact bit location of the errors are not transmitted back to the tester in real time. If desired, the interface circuitry 226 may be configured with a bypass mode which allows the tester 108 to query any failed locations of any particular DUT to determine the exact bit locations of the error. This will typically be done following completion of the test sequence. Alternatively, the memory 399 may be used to collect the error data for post processing by the tester 108 or system controller 104.

Figure 6:
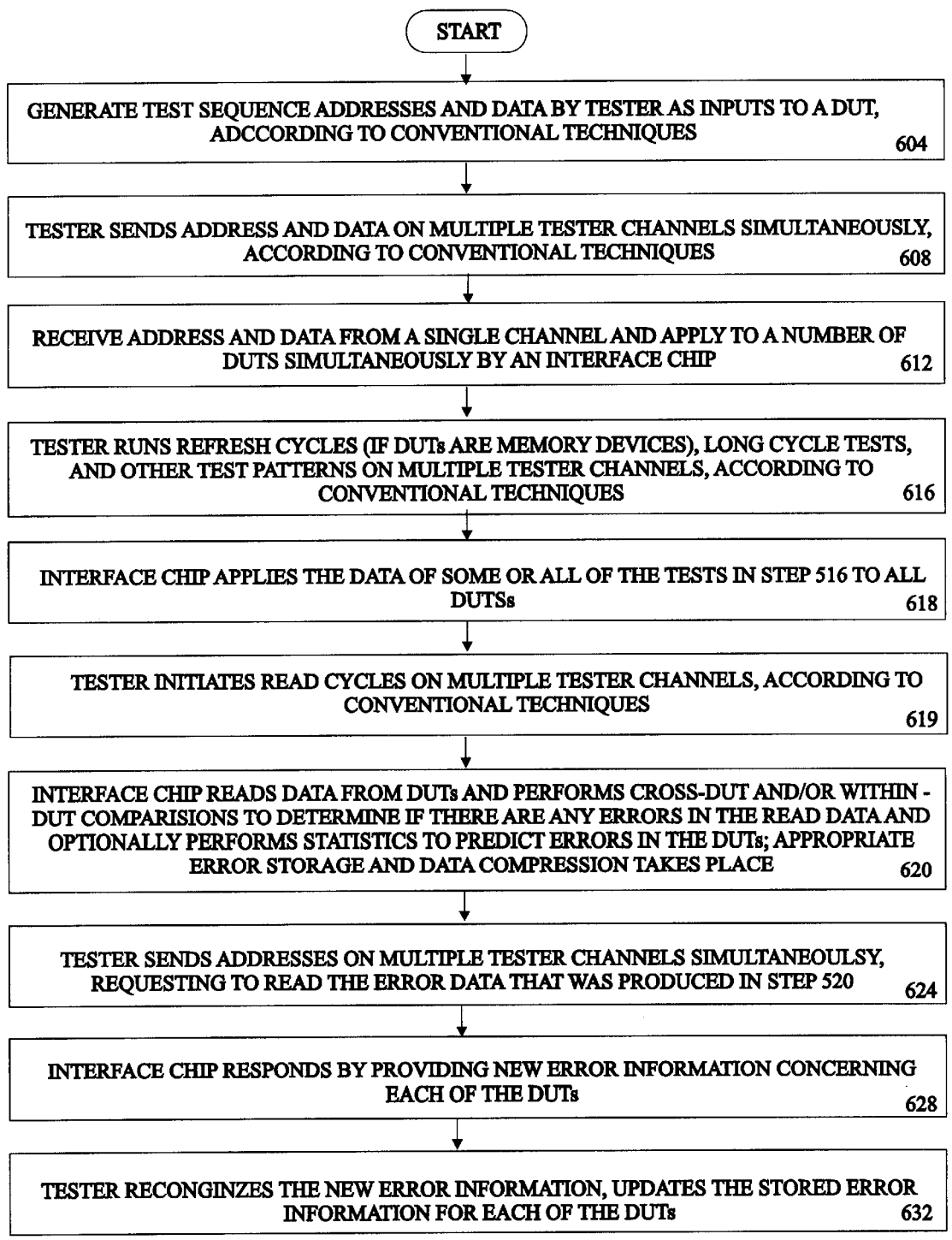
FIG. 6 is a flow diagram for testing devices without receiving expected data from the tester.

FIG. 6 is a flow diagram of an alternative technique for determining error information using the interface circuitry 226, without delivering expected data over the tester channels. The interface circuitry may be configured to operate in this and, in general, in different modes in response to instructions received from the tester. See, for example, U.S. patent application of Ray and Miller entitled EFFICIENT PARALLEL TESTING OF INTEGRATED CIRCUIT DEVICES USING A KNOWN GOOD DEVICE TO GENERATE EXPECTED RESPONSES (P078). Operations 604–616 may be performed in the same manner as operations 504–516 in; FIG. 5. Once the interface circuitry 226 has applied test data to its corresponding DUTs in step 618, operation continues with step 619 in which the tester 108 initiates a read cycle on each channel to read from the locations to which it previously wrote. The interface circuitry 226 responds in step 620 by reading from its corresponding DUTs, and performs comparisons of data values across DUTs and/or within DUTs to determine any errors in the DUTs. For instance, the interface circuitry 226 may be configured to perform comparisons of groups of bits read from locations within the same DUT, where each group had the same bit pattern written to them in step 618. Such a conventional technique is discussed below in connection with FIG. 7. In addition or instead of the conventional technique, the interface circuitry 226 can be further configured to perform comparisons of bits read from locations in different DUTs. This latter technique is described below in relation to FIG. 8. A combination of these two techniques of "within word" and "across DUT" comparisons is illustrated in FIGS. 9a and 9b. Thus, in contrast to the embodiment of FIG. 5, the tester 108 in FIG. 6 does not send expected data to the interface circuitry 226 during the test sequence. Rather, the interface circuitry 226 performs cross-DUT and within-DUT comparisons, such as in FIGS. 7–9 below, and optional statistics, to predict errors in the DUTs with relatively high confidence. Appropriate storage of the error data and compression also takes place. Eliminating the cycle of sending expected data may further reduce the time needed to test the DUTs, thus promoting a more efficient testing methodology.

Regardless of which technique is used to generate the error information in step 520/620, operation continues in FIG. 5 with steps 524 and 528 (and corresponding steps 624 and 628 in FIG. 6) in which the interface circuitry 226 provides error information concerning each of the DUTs in response to a request from the tester 108 to read from particular addresses. Operation then continues with step 532/632 in which the tester 108, according to a modified test program, recognizes that the new error information relates to a number of DUTs rather than to a single DUT, and updates its stored error information for each of the DUTs accordingly. Steps 504–532 described above may be repeated many times as required by the test sequence 106 (see FIG. 1).

As mentioned above, step 520 in FIG. 5 involves performing a comparison by the comparison circuitry 330 (see FIG. 3) to determine if there are any errors in the read data obtained from the DUTs. Several techniques for performing the comparison are presented in this disclosure. One such technique that was introduced above configures the comparison circuit 330 to perform an exclusive OR (XOR) operation upon corresponding bits of an expected data value received from the tester 108 and of a read data value from a DUT.

Figure 7:
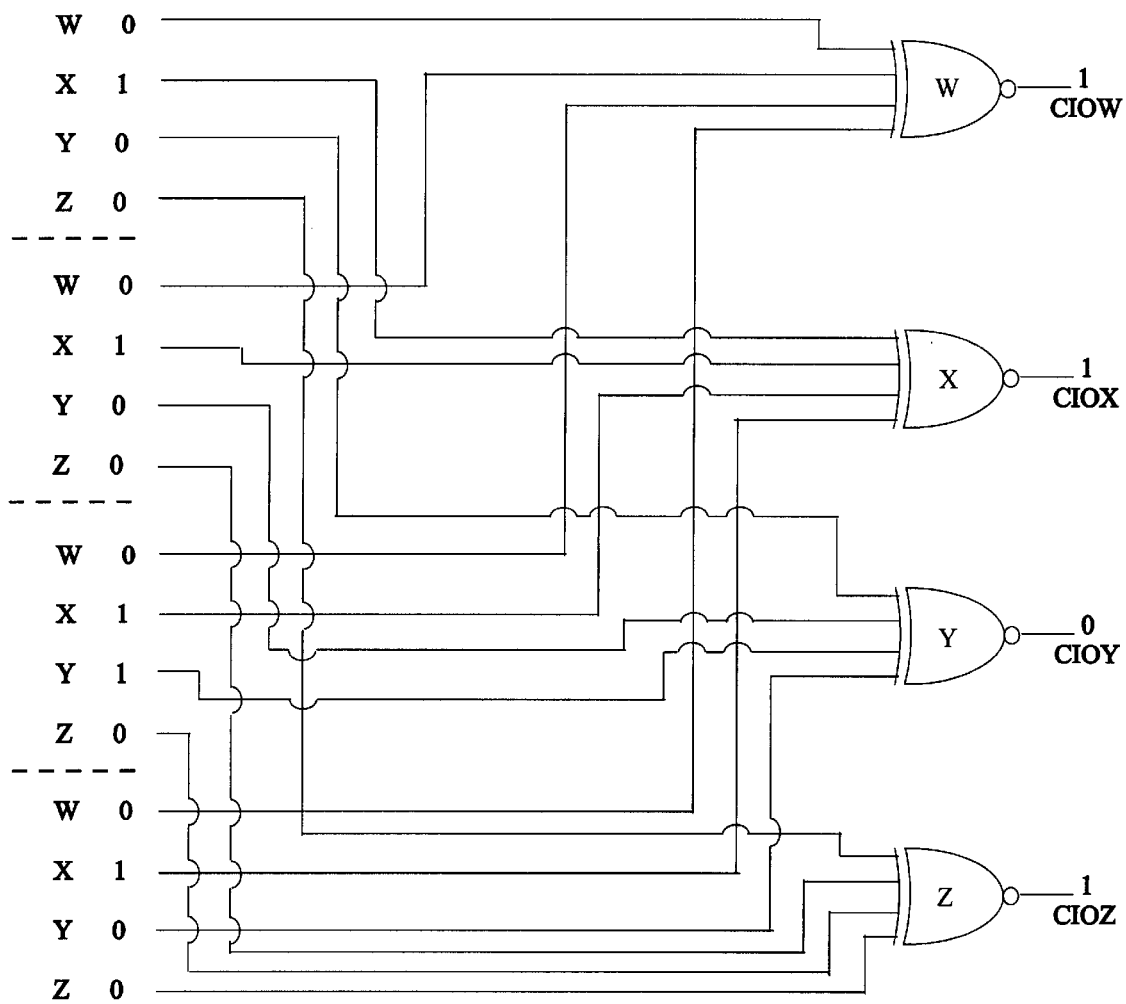
FIG. 7 shows a conventional technique for testing a 16-bit word of a memory device.

In contrast, FIG. 7 shows a conventional technique for performing a comparison within a location or data word of a DUT. The objective here is to obtain a 4-bit compressed error value that represents errors, if any, in a 16-bit word of a single DUT. Using this technique, 4 DUTs may be tested in parallel so that 16 bits of error data can be returned to the tester 108 through a 16-bit data bus of the channel. In FIG. 7, a 16-bit data word to be compared is divided into four groups of 4 bits referenced W, X, Y, and Z. In this case, it is assumed that the pattern of data that was written to this data word repeats every 4 bits such that each group should have the identical bit pattern. In the particular example of FIG. 7, CIOW, CIOX, CIOZ all indicate a positive result. This means that all of the W, X, and Z bits in the data word are correct. In contrast, CIOY indicates a negative result for bit location Y, without specifying which group contains the error in bit Y. Although this type of compressed error information provides an incomplete picture of the errors encountered in a data word, it may nonetheless be useful in certain situations where, for instance, the DUT contains redundant circuitry that can replace the circuitry which provided the failing Y bits.

One drawback of the conventional approach in FIG. 7 is that a false positive result of a comparison CIO could be generated when all corresponding bits of a given location are in error. For instance, with CIOY indicating a negative result, at most 1, 2, or 3 of the four corresponding Y bits can be-in error. If all four of the Y bits were in error, however, then CIOY would indicate a positive result, because all four inputs to its XOR gate would have the same value. Although it is a rare case where all four corresponding bits are in error, it is desirable to eliminate or at least reduce the occurrence of such a false positive result. This could be accomplished by configuring the interface circuitry 226 into a bypass mode and running a conventional test using tester 108 to test a single device of the multiple devices for absolute accuracy.

Figure 8:
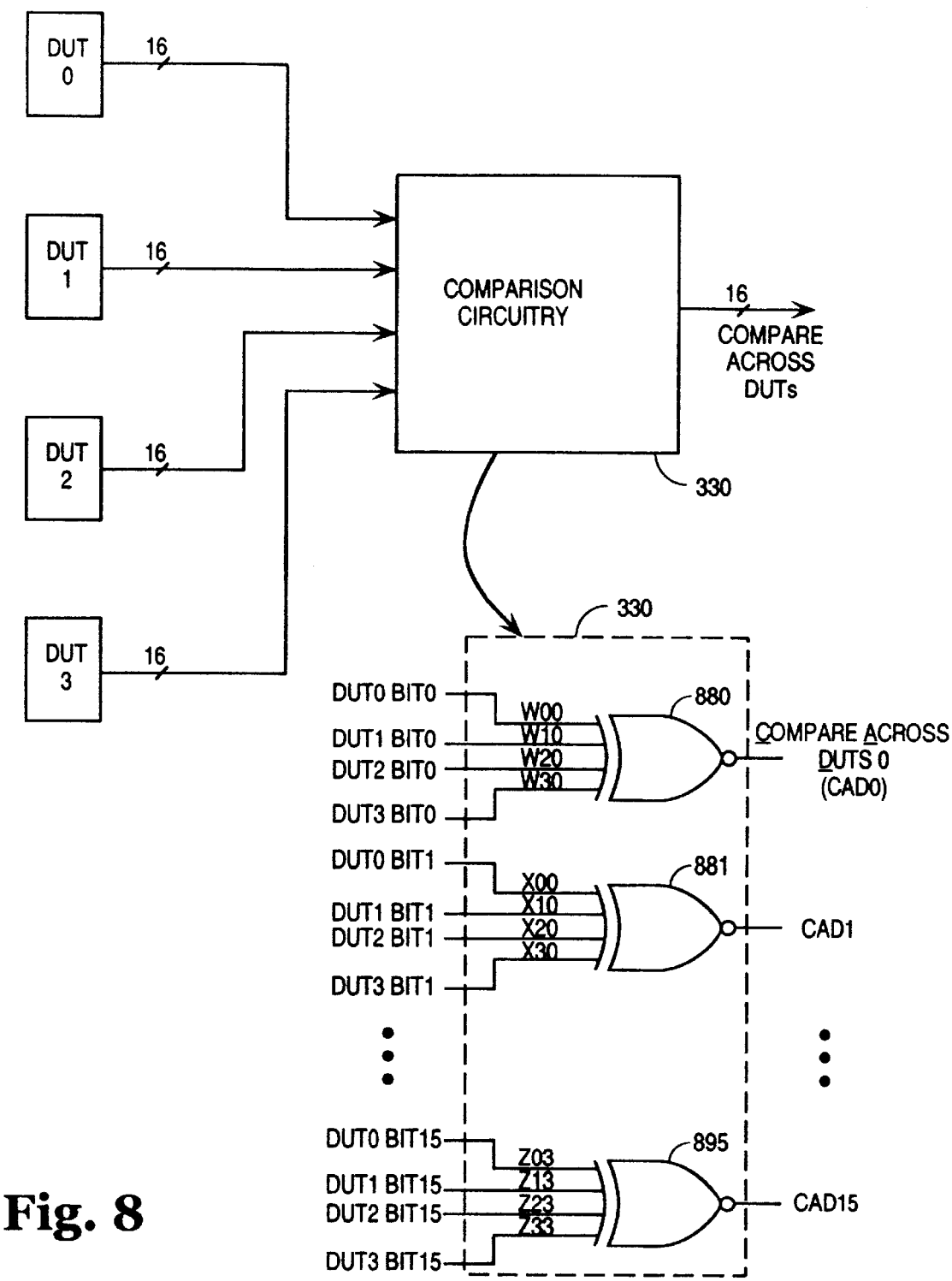
FIG. 8 shows a technique for providing error values concerning four DUTs on a channel being 16-bits wide, using comparisons made across DUTs, according to another embodiment of the invention.
Figure 9A:
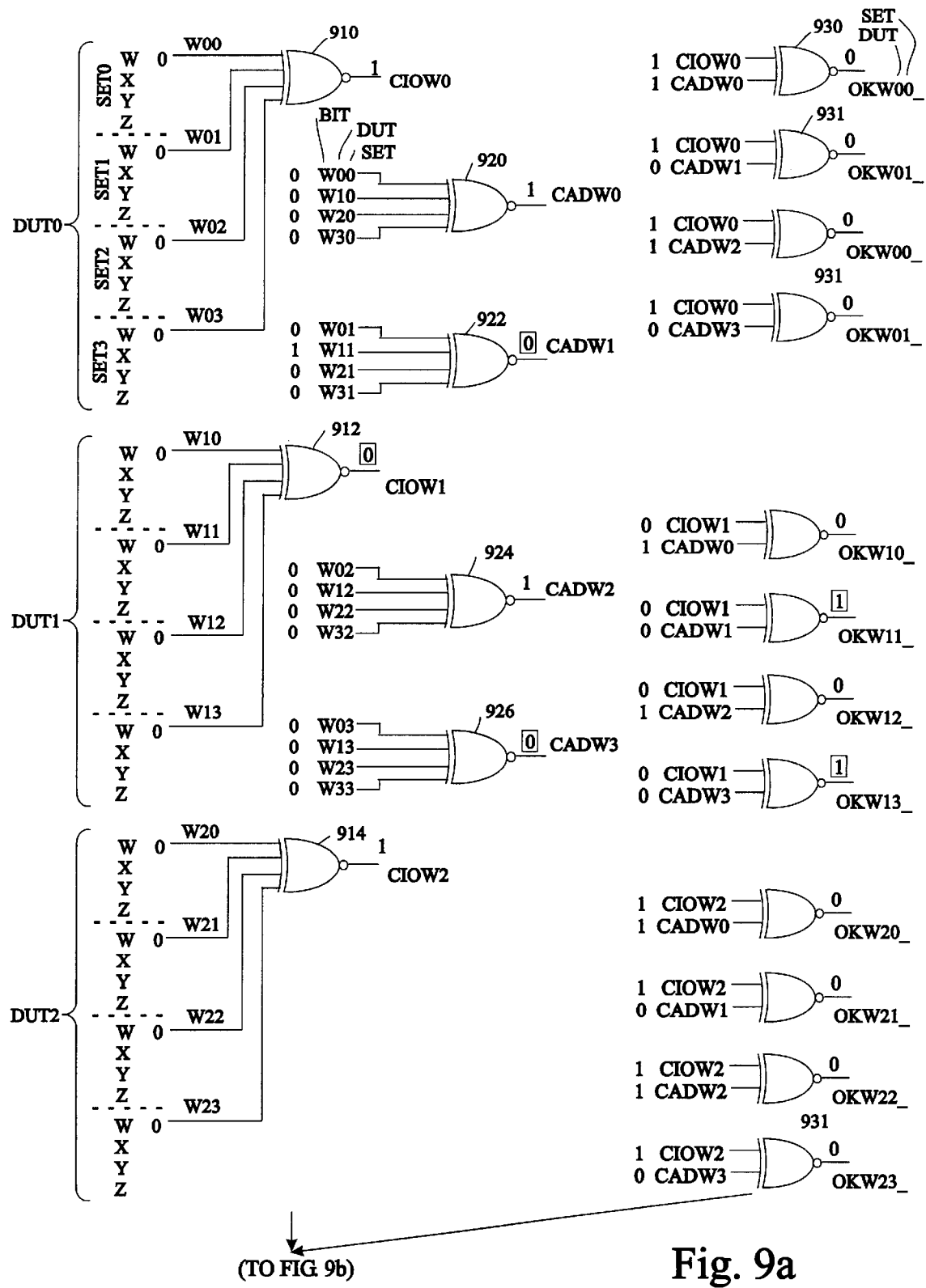
FIGS. 9a and 9b show a technique for testing four DUTs using a combination of within-word comparisons and across-DUT comparisons, according to another embodiment of the invention.
Figure 9B:
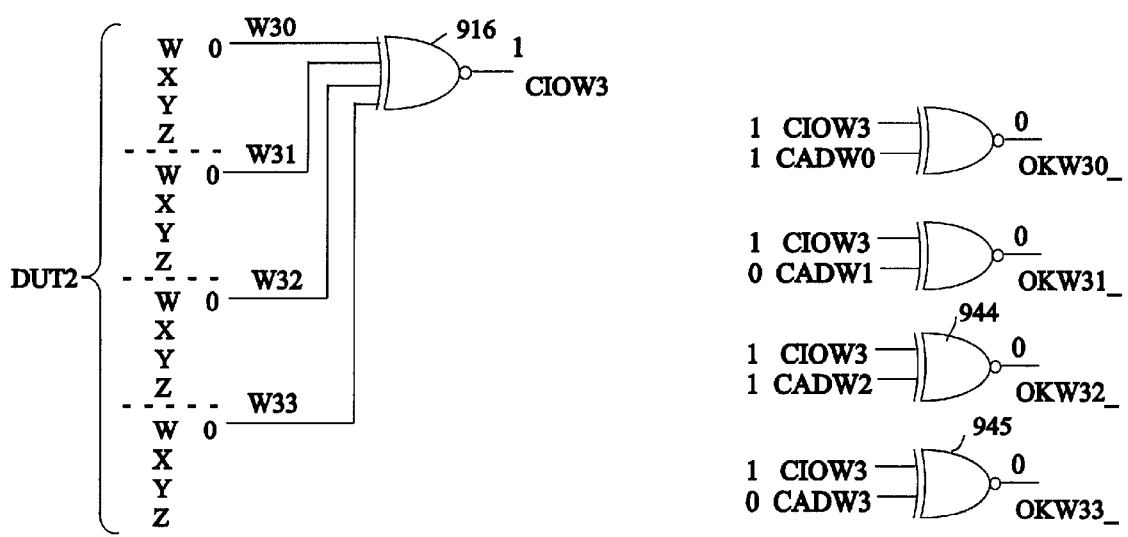

FIG. 8 illustrates another technique of performing a comparison. Such a technique involves comparing bits from different DUTs. Although FIG. 8 shows comparing across 4 DUTs, the concept may be implemented with any number of DUTs, within practical limitations, of course. Once again, this scheme assumes that the comparisons made by each XOR gate are of bit values that should be the same, such that a positive result is generated only if all bits have the same 0 or 1 value. For this example, each data word comprises 16 bits. The first XOR gate 880 provides a Compare Across DUTs of bit 0 in each of the DUTs (CAD0). Similarly, CAD1 from XOR gate 881 gives the result of comparing bit 1 in each of the DUTs and so on until CAD15 provided by XOR gate 895. In contrast to the repetitive pattern required for the conventional technique in FIG. 7, this approach allows an arbitrary pattern of data to be written in each word. However, the CAD result does not indicate which DUT contains the error, but only that one or more bits are in error. The CAD result will give a false positive result if 4 corresponding bits in 4 different DUTs are all in error. As mentioned previously, this situation can be avoided by testing at least one of the DUTs for absolute accuracy using the bypass mode.

FIGS. 9a and 9b illustrate a combination of within word and across DUT comparisons which increases the confidence in a positive result by several orders of magnitude over either the conventional technique of FIG. 7 or the across DUT comparison in FIG. 8. The schematic in FIGS. 9a and 9b shows the comparison circuitry for bit W which is the first of 4 bits in a group, where each data word comprises 4 such groups. Thus, the circuitry shown in FIGS. 9a and 9b will be repeated 3 times to provide the results of comparisons for bits X, Y, and Z.

The first series of XOR gates 910, 912, 914, and 916 provide the results CIOW0, CIOW1, CIOW2, and CIOW3, respectively. CIOW0 is the result of a within word comparison of bits W in a single word of DUT0. Similarly, CIOW1 is the result of a comparison of bit W in a single word of DUT1, and so on.

The second series of exclusive OR gates in FIGS. 9a and 9b are 920, 922, 924, and 926 providing CADW0, CADW1, CADW2, and CADW3, respectively. CADW0 is a comparison of bits W in set 0 of each DUT, CADW1 compares bits W in set 1 of each DUT, and so on. Thus, the CADW result is similar to the CAD result of FIGS. 8 except that only 4 bits (the W bits) are compared.

Finally, the third series of gates in FIGS. 9a and 9b are 930–945, a total of 16 NOR gates each providing an OKW_result. The first 4 results OKW00_ to OKW03_ indicate errors, if any, in bits 1 of one or more of the 4 sets that define a word in DUT0. Similarly, OKW10_ to OKW13_ indicate errors in bits W of the 4 sets that define a corresponding word of DUT1, and so on. Note that the exact location of the error is given, i.e., no compression is performed, because one bit is used to indicate an error in bit W of a particular set in a data word in a given DUT. When the circuitry of FIGS. 9a and 9b is repeated for bits X, Y, and Z, a total of 16×4=64 error bits are available to exactly indicate errors in any bit of a data word, in any given DUT.

If desired to return error information concerning two or more DUTs back to the tester 108 over a single channel, compression may be performed to reduce the 16 bits of error information into 4 bits in order to efficiently use a 16-bit address bus of the channel. For instance, with only 4 bits of compressed error data for each DUT, each bit indicates an error, if any, in a corresponding 4-bit set of a 16-bit data word. As mentioned before, the tester 108 may nonetheless make valuable use of such information, for example by repairing the DUT if redundant circuitry is available in the DUT to replace a failed circuit.

Figure 10:
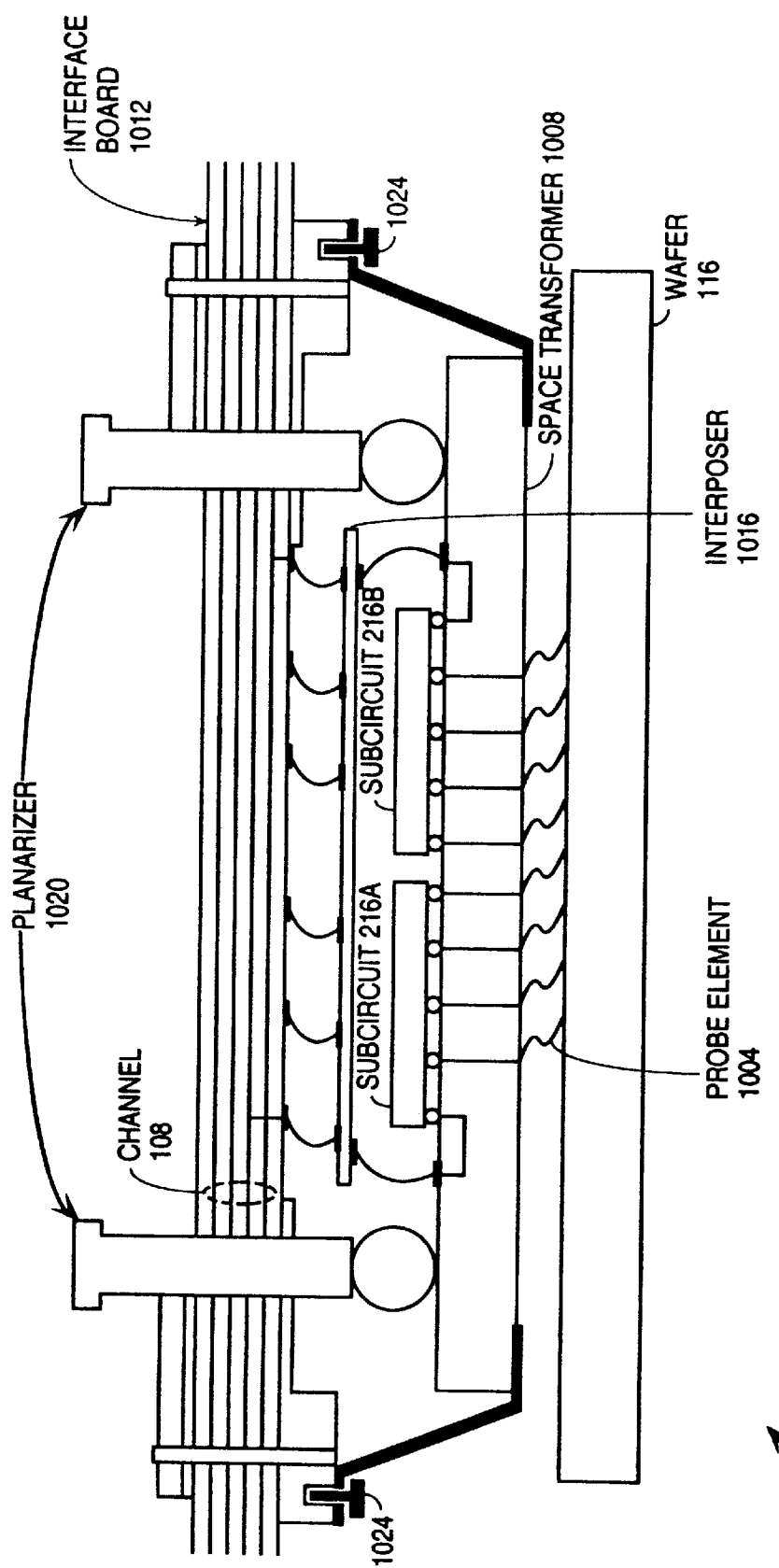
FIG. 10 illustrates a probe card according to another embodiment of the invention.

FIG. 10 illustrates a probe card 1000 comprising subcircuits 216a and 216b of the interface circuitry 226, according to another embodiment of the invention. The probe card 1000 features a number of probe elements 1004 for electrically connecting signal points of a DUT to its respective subcircuit. The probe elements 1004 are attached to a space transformer 1008 on the opposite side of which the IC die of the subcircuits are attached. Signals are transported to and from a controlled impedance tester interface board 1012 using a resilient interposer 1016. The tester channel appears as traces in the interface board 1012. The space transformer 1008 and the interface board 1012 are normally kept at a fixed relationship with each other, such as by using fasteners 1024. A planarizer 1020 may be provided to place all of the probe elements into planar alignment with the wafer 116 under test. In operation, the probe card is lowered on to the surface of the wafer 116 for the probe elements to contact the signal points of the DUTs that form the wafer. Further details concerning this embodiment may be found in U.S. patent application Ser. No. 08/554,902, filed Nov. 19, 1995, entitled, *Probe Card Assembly With Space Transformer and Interposer*, or in the corresponding PCT application published May 23, 1997 as WO96/15458(P006).

To summarize, various embodiments of the invention for testing a number of DUTs in parallel using a single channel of a conventional tester have been disclosed. One of ordinary skill in the art will recognize that the invention is capable of use in various other combinations and environments and is capable of changes and modifications within the scope of the inventive concept expressed here. For instance, the interface circuitry described in different embodiments above would normally be implemented as one or more integrated circuit chips, each corresponding to a subcircuit, that reside on a probe card. In this way, the drive and sense electronics in the DUT ports are physically closer to the actual DUTs, thereby providing a less problematic and more cost effective electrical connection between the DUTs and the comparison circuitry. An alternative to the wafer probe card embodiment would be to place the interface circuitry upon a test fixture between the tester channel and a tray of packaged IC devices, where each DUT is part of a packaged device rather than a portion of a wafer. Accordingly, it is intended that all such modifications and/or changes be within the scope of the claims.

What is claimed is:

1. A contact assembly comprising:
two or more sets of first elements, each set of elements is to contact a plurality of signal locations of a separate device under test (DUT); and
first circuitry having an input to be coupled to a set of I/O lines of a tester and an output coupled to the two or more sets of elements, to provide a write data value, received from the tester, on each set of said elements,
the circuitry being further configured to read from each DUT a read data value, in response to receiving a read command from the tester over the set of I/O lines, perform a comparison between said read data value and an expected data value received from the tester, to determine an error in each DUT, and send an error value, indicative of the error in each DUT, to the tester over the set of tester I/O lines, wherein the first circuitry is coupled to receive the write data value over one or more data lines of the set of I/O lines, and the error value is to be carried by said one or more data lines used to carry the write data value;

two or more sets of second elements, each set of second elements to contact a plurality of signal locations of a separate device under test (DUT); and second circuitry having an input to be coupled to a further set of I/O lines of the tester and an output coupled to the two or more sets of second elements, to provide a write data value, received from the tester and carried by one or more data lines of the further set of I/O lines, on each set of said second elements, the second circuitry being further configured to read from each DUT that is contacted by the second elements a read data value, in response to receiving a read from the tester over the further set of I/O lines, perform a comparison using said read data value to determine an error in each DUT, and send a second error value, indicative of the error in each DUT that is contacted by the second elements, to the tester over the further set of I/O lines, the second error value to be carried by said one or more data lines in the further set of I/O lines used to carry the write data value.

2. The contact assembly of claim 1 wherein the first and second circuitry are formed as separate application specific integrated circuits (ASICs).

3. The contact assembly of claim 1 in combination with said tester having a set of I/O lines coupled to the input of the first circuitry in said contact assembly.

4. The contact assembly of claim 1 in combination with said tester, wherein the tester is configured to test a DUT as being a memory device.

5. The contact assembly and tester combination of claim 4 wherein each bit of the error value is to be carried on a separate one of said one or more data lines of the set of I/O lines, an error status of each DUT being represented by a separate bit of the error value.

6. The contact assembly of claim 1 wherein the sets of first and second elements are configured to contact each DUT as part of a packaged semiconductor integrated circuit device.

7. The contact assembly of claim 1 wherein the read data value and the error value are each no more than M bits long, the data lines of each set of I/O lines are M bits wide, and the error value contains information regarding errors in corresponding locations of two or more DUTs each of which can store data values up to M bits long.

8. The contact assembly of claim 1 wherein the error value does not indicate an exact bit location of an error in the DUTs.

9. The contact assembly of claim 1 wherein the first and second circuitry is to communicate with each DUT as being a memory device, and wherein the error value represents a difference between a data value read from a memory device and an expected data value received by the first and second circuitry for a predefined memory address.

* * * * *